United States Patent
Wang

(10) Patent No.: US 10,707,887 B2
(45) Date of Patent: Jul. 7, 2020

(54) VECTOR QUANTIZATION DIGITAL-TO-ANALOG CONVERSION CIRCUIT FOR OVERSAMPLING CONVERTER

(71) Applicant: Shenzhen Goodix Technology Co., Ltd., Shenzhen, Guangdong (CN)

(72) Inventor: Wen-Chi Wang, Guangdong (CN)

(73) Assignee: Shenzhen Goodix Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 16/659,552

(22) Filed: Oct. 21, 2019

(65) Prior Publication Data
US 2020/0052709 A1 Feb. 13, 2020

Related U.S. Application Data

(63) Continuation of application No. 16/154,730, filed on Oct. 9, 2018, now Pat. No. 10,491,229, which is a
(Continued)

(51) Int. Cl.
*H03M 1/66* (2006.01)
*H03M 1/06* (2006.01)

(52) U.S. Cl.
CPC .......... *H03M 1/0668* (2013.01); *H03M 1/66* (2013.01)

(58) Field of Classification Search
CPC ........ H03M 1/0668; H03M 1/66; H03M 3/30; H03M 3/50; H03M 7/30004; H03M 1/12; H03M 3/412
(Continued)

(56) References Cited

U.S. PATENT DOCUMENTS 5,502,441 A * 3/1996 Swenson ................. G06T 9/008
341/172
7,130,876 B2 10/2006 Chatterjee
(Continued)

FOREIGN PATENT DOCUMENTS

| CN | 1855727 A | 11/2006 |
| CN | 101562454 A | 10/2009 |
| CN | 106899304 A | 6/2017 |

OTHER PUBLICATIONS

Tao Shui et al., Mismatch-Shaping DAC for Lowpass and Bandpass Multi-Bit Delta-Sigma Modulators, 1998, pp. I-352-I-355, IEEE, XP010289665.
(Continued)

*Primary Examiner* — Jean B Jeanglaude
(74) *Attorney, Agent, or Firm* — Winston Hsu

(57) ABSTRACT

The present application provides a vector quantization digital-to-analog conversion circuit, for converting a digital signal to an analog signal, characterized by includes a vector quantization circuit, configured to receive the digital signal and generate a vector quantization signal; a data weighted averaging circuit, coupled to the vector quantization circuit, including a plurality of data weighted averaging sub-circuits, configured to receive the vector quantization signal to generate a plurality of data weighted averaging signals; and a digital-to-analog conversion circuit, coupled to the data weighted averaging circuit, including a plurality of digital-to-analog conversion sub-circuits, configured to receive the data weighted averaging signal to generate the analog signal.

20 Claims, 8 Drawing Sheets

Related U.S. Application Data continuation of application No. PCT/CN2017/096259, filed on Aug. 7, 2017.

(58) Field of Classification Search
USPC .................................. 341/144, 155, 153
See application file for complete search history.

(56) References Cited

U.S. PATENT DOCUMENTS

| | | | |
|---|---|---|---|
| 7,173,966 B2 | 2/2007 | Miller | |
| 7,283,081 B2* | 10/2007 | Chin ................... | H03M 1/0668 341/118 |
| 7,508,331 B2* | 3/2009 | Magrath ............. | H03M 1/0668 341/143 |
| 7,623,055 B2* | 11/2009 | Ido ..................... | H03M 1/0668 341/144 |
| 7,729,553 B2* | 6/2010 | Fievet ................. | H03M 1/0668 341/79 |
| 8,098,718 B2* | 1/2012 | Sienko ................ | H03M 1/0668 341/143 |
| 8,144,043 B2* | 3/2012 | Risbo ................. | H03M 7/3006 341/143 |
| 9,300,311 B2* | 3/2016 | Lan .................... | H03M 1/0668 |
| 9,792,922 B2 | 10/2017 | Svedberg | |
| 2004/0240588 A1 | 12/2004 | Miller | |
| 2011/0002264 A1 | 1/2011 | Sienko | |
| 2012/0028824 A1 | 2/2012 | Larue | |

OTHER PUBLICATIONS

Ichiro Fujimori et al., A Multibit Delta-Sigma Audio DAC with 120-dB Dynamic Range, IEEE Journal of Solid-State Circuits, Aug. 2000, pp. 1066-1073, vol. 35, No. 8, IEEE, XP011450288.

* cited by examiner

VECTOR QUANTIZATION DIGITAL-TO-ANALOG CONVERSION CIRCUIT FOR OVERSAMPLING CONVERTER

CROSS REFERENCE TO RELATED APPLICATIONS

This application is a continuation application of U.S. application Ser. No. 16/154,730 filed on 2018 Oct. 9, which is a continuation application of international application No. PCT/CN2017/096259, filed on Aug. 7, 2017.

FIELD OF THE INVENTION

The present application relates to a vector quantization digital-to-analog conversion circuit, and more particularly, to a vector quantization digital-to-analog conversion circuit applied to an oversampling converter.

BACKGROUND

A converter may be roughly classified into two structures of operating in the Nyquist Rate or operating in the Oversampling Rate (OSR), wherein the converter operating in the oversampling rate is benefited by the two frequency response characteristics of performing low pass filtering for signal and performing high pass filtering for noise at the same time, and achieves a goal of separating the signal and the noise and eventually reduce the noise in baseband. With a simple exchange of a filter, the oversampling converter may realize the response characteristic of performing bandpass for the signal and performing band-rejection for the noise in an intermediate frequency, so as to realize the separation of the band-pass signal and the intra-band noise, and meanwhile, finish the filtering of the band-pass signal and conversion of digital and analog signal.

No matter for an oversampling digital-to-analog converter or an oversampling analog-to-digital converter, the interior circuit must have a digital-to-analog converter. In general, the digital-to-analog converter is configured to utilize an selected amount of interior elements to output an analog voltage, and each element may generate the same voltage with the same value to determine an output analog voltage value according to the selected amount of the interior elements, so as to realize a circuit of converting a digital quantity into an analog voltage quantity. However, since differences in element size or characteristic caused by manufacturing crafts, voltage values generated by the interior elements are not actually the same, which causes errors of the conversion from the digital quantity into the analog quantity, and further affects accuracy and performance of the digital-to-analog converter, and affects the oversampling converter. Therefore, the conventional technique has developed a technique which utilizes data weighted averaging to improve declining performance caused by mismatch of the interior selected elements. However, a repetition of selected elements of the conventional data weighted averaging technique causes the mismatch of the elements in spectrum and generates noise voltage, which affects the signal quality and circuit performance. Accordingly, an improvement to the repetition of the selected elements of the conventional technique is to add one or more extra elements to perform the data weighted averaging so as to increase the amount of the elements and reduce the repetition of the selected elements. However, the improvement reduces the noise voltage caused by the mismatch of the elements but the noise voltage does not disappear, and the repetition of the selected elements with a specific input range still occurs, which affects the performance of the digital-to-analog converter.

Therefore, it is necessary to improve the conventional technique.

SUMMARY

It is therefore a primary objective of the present application to provide a digital-to-analog converter with vector quantization technique, which applies an oversampling sigma-delta (IA) digital-to-analog converter and an analog-to-digital converter to eliminate noise voltages in spectrum so as to achieve better signal to noise ratio (SNR) and improve drawbacks of the conventional technique.

To solve the technical problems mentioned above, the present application provides a vector quantization digital-to-analog conversion circuit, for converting a digital signal to an analog signal, characterized by comprising: a vector quantization circuit, configured to receive the digital signal and generate a vector quantization signal; a data weighted averaging circuit, coupled to the vector quantization circuit, comprising a plurality of data weighted averaging sub-circuits, configured to receive the vector quantization signal to generate a plurality of data weighted averaging signals; and a digital-to-analog conversion circuit, coupled to the data weighted averaging circuit, comprising a plurality of digital-to-analog conversion sub-circuits, configured to receive the data weighted averaging signal to generate the analog signal.

Preferably, the plurality of digital-to-analog conversion sub-circuits are configured to receive the data weighted averaging signal to generate an analog voltage and output the analog signal after summing the analog voltage.

Preferably, an adder, coupled to the plurality of digital-to-analog conversion sub-circuits and configured to sum the analog voltage.

Preferably, the plurality of data weighted averaging sub-circuits are respectively coupled to the plurality of digital-to-analog conversion sub-circuits; an amount of the plurality of data weighted averaging sub-circuits is identical to an amount of the plurality of digital-to-analog conversion sub-circuits.

Preferably, the vector quantization circuit comprises a quotient calculator, configured to receive the digital signal to generate a quotient vector; a remainder calculator, configured to receive the digital signal to generate a remainder; a quantization circuit, coupled to the remainder calculator, configured to receive the remainder to output a sorting vector; wherein after summing the quotient vector and the sorting vector, the vector quantization signal is generated.

Preferably, the vector quantization circuit further comprises a loop circuit, coupled to the quantization circuit, configured to receive a subtraction result of a weighted vector and the sorting vector to output an initial vector; and an extreme circuit, coupled to the loop circuit, configured to receive the initial vector to output an updated weighted vector.

Preferably, information of allocation times of the sorting vector is recorded in the updated weighted vector.

Preferably, the quantization circuit is configured to receive the remainder and sort the remainder according to the updated weighted vector to output the sorting vector; the sorting vector includes digital numbers 0 and 1, an amount of the digital number 1 of the sorting vector is identical to the remainder and an amount of the digital number 0 of the sorting vector is identical to N subtracting the remainder, and N is an amount of the plurality of digital-to-analog conversion sub-circuits; the quotient vector includes N quotients.

Preferably, the loop circuit is configured to provide a delay and receive the subtraction result of the weighted vector and the sorting vector, the subtraction result is outputted after the delay, taken as the initial vector and transmitted to the extreme circuit.

Preferably, the updated weighted vector comprises at least a numerical value of zero, and the numerical value is a minimum of the updated weighted vector.

Preferably, the extreme circuit is a minimum circuit, configured to detect a minimum of the initial vector and to subtract the minimum from all numerical values of the initial vector to generate the updated weighted vector.

Preferably, the quotient calculator and the remainder calculator have a same divisor, wherein the divisor and a vector dimension of the updated weighted vector, the initial vector, the sorting vector and the quotient vector are identical; an amount of the quotient calculator and the remainder calculator is identical to an amount of the plurality of digital-to-analog conversion sub-circuits.

The present application further provides a vector quantization digital-to-analog conversion method, for converting a digital signal to an analog signal, characterized by comprising: receiving the digital signal and generate a vector quantization signal; receiving the vector quantization signal to generate a plurality of data weighted averaging signals; and receiving the data weighted averaging signal to generate the analog signal.

The present application further provides an oversampling converter, configured to convert an analog signal to a digital signal, characterized by comprising a loop filter, configured to output a loop filtering signal; a quantizer, configured to output a quantization digital signal; and a vector quantization digital-to-analog conversion circuit, configured to output a vector quantization analog signal, wherein the vector quantization digital-to-analog conversion circuit is the vector quantization digital-to-analog conversion circuit in claim 1; wherein the quantizer is coupled between the loop filter and the vector quantization digital-to-analog conversion circuit.

The present application utilizes the vector quantization digital-to-analog conversion circuit to increase an entropy of an allocation of the digital signal, eliminate the noise voltage of the oversampling converter and increase the signal quality.

DETAILED DESCRIPTION

Figure 1:
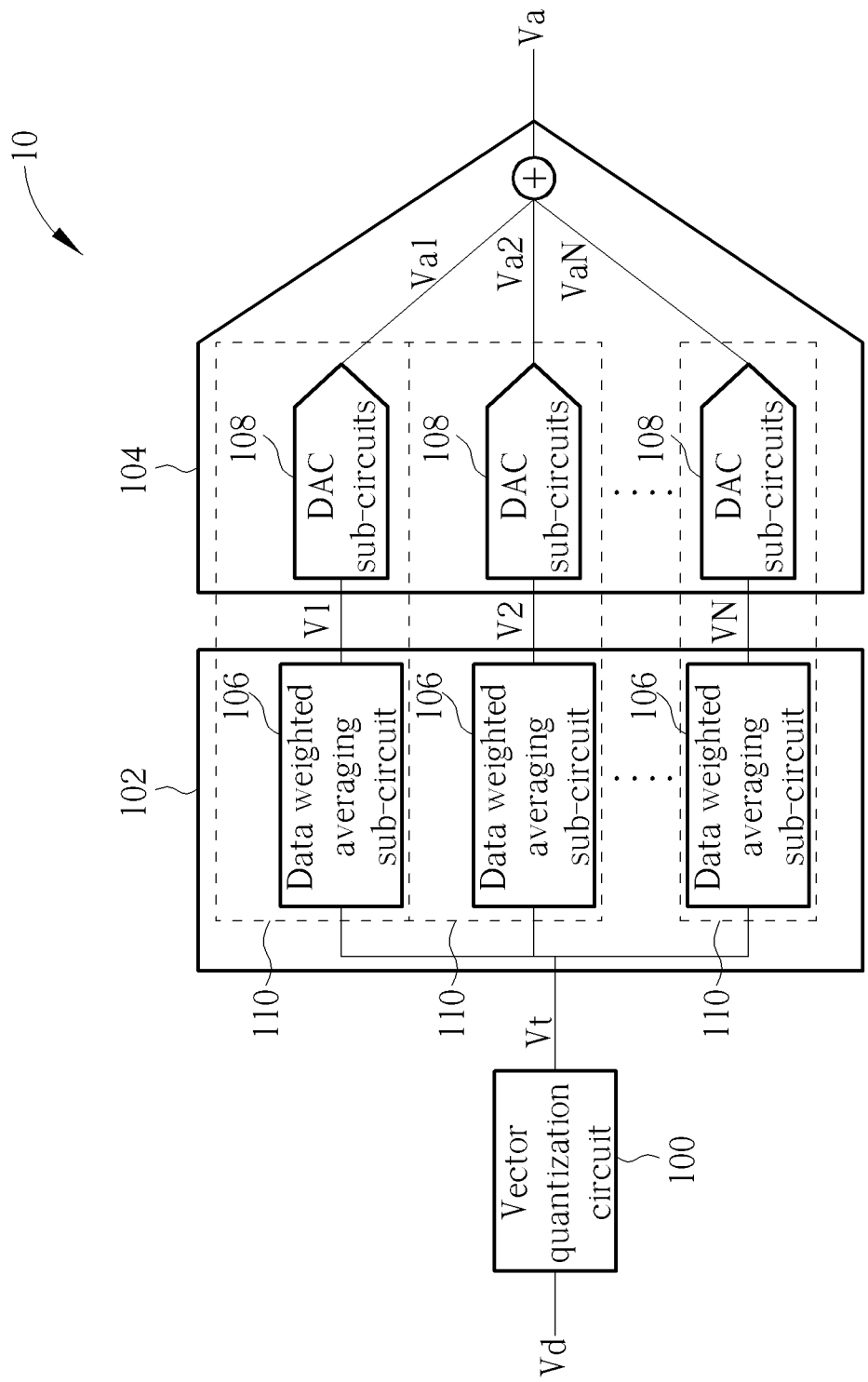
FIG. 1 is a schematic diagram of a vector quantization digital-to-analog conversion circuit according to an embodiment of the present application.

Please refer to FIG. 1, which is a schematic diagram of a vector quantization digital-to-analog conversion circuit 10 according to an embodiment of the present application. The vector quantization digital-to-analog conversion circuit 10 may be applied to a digital-to-analog conversion circuit adopting an oversampling conversion circuit, which allocates an input signal Vd by a vector quantization method to suppress a noise voltage shaping effect, which is unable to be achieved by the conventional art, and to optimize performance of the oversampling conversion circuit. As shown in FIG. 1, the vector quantization digital-to-analog conversion circuit 10 is configured to receive a digital signal Vd to output an analog signal Va after conversion, which converts the binary value of the digital signal Vd into the analog signal Va with corresponding voltage. The vector quantization digital-to-analog conversion circuit 10 includes a vector quantization circuit 100, a data weighted averaging (DWA) circuit 102 and a digital-to-analog converter (DAC) 104. The data weighted averaging circuit 102 includes N data weighted averaging sub-circuits 106, and the DAC 104 includes N digital-to-analog conversion sub-circuits 108, which are respectively coupled to the N data weighted averaging sub-circuits to form N sub-signal paths 110. The vector quantization circuit 100 receives the digital signal Vd to generate a vector Vt of N dimensions, and the vector Vt is $Vt=(Vt1, Vt2, \ldots, VtN)$, wherein Vt1-VtN are respectively output to the data weighted averaging sub-circuits 106, which generates V1-VN according to Vt1-VtN, and outputs V1-VN to the digital-to-analog conversion sub-circuits 108. Then, the digital-to-analog conversion sub-circuits 108 respectively receive V1-VN to generate the analog voltages Va1-VaN, which are summed to output the analog signal Va.

The vector quantization circuit 100 receives the digital signal Vd and outputs the vector Vt to the data weighted averaging circuit 102, and the N digital signals Vt1-VtN of the vector Vt are respectively output to the N sub-signal paths 110, the vector quantization circuit 100 allocates the digital signal Vd to the vector Vt with the vector quantization method and outputs the vector Vt to the data weighted averaging circuit 102. In other words, the vector quantization circuit 100 allocates values of the digital signal Vd to the digital signals Vt1-VtN and outputs to the N sub-signal paths 110 for operations of corresponding circuits.

The data weighted averaging circuit 102 receives the vector Vt, and the N data weighted averaging sub-circuits 106 respectively receive the digital signals Vt1-VtN and output the digital signals V1-VN, wherein the data weighted averaging sub-circuits 106 are configured to accumulate and record the received digital signals Vt1-VtN to generate the digital signals V1-VN by a circular pointer, so as to record allocation times stored by the digital signals V1-VN, i.e. to record the allocation times of the respective digital-to-analog conversion sub-circuits 108.

Furthermore, the N the digital-to-analog conversion sub-circuits 108 respectively receive V1-VN, and respectively generate the analog voltages Va1-VaN, which are summed to generate the analog signal Va. Under the situation, the vector quantization digital-to-analog conversion circuit 10 allocates the digital signal Vd as the vector Vt by the N sub-signal paths 110, and outputs the N digital signals Vt1-VtN of the vector Vt of N dimensions to the corresponding N sub-signal paths 110, so as to increase an entropy of the digital signal Vd and reduce a periodicity caused by a mismatching of selected elements in the digital-to-analog conversion sub-circuits 108 when the data weighted averaging sub-circuits 106 are inputted with specific data values, which reduces a noise voltage caused by the mismatching of elements, and suppresses the noises on spectrum and improves signal-to-noise ratio (SNR).

Figure 2:
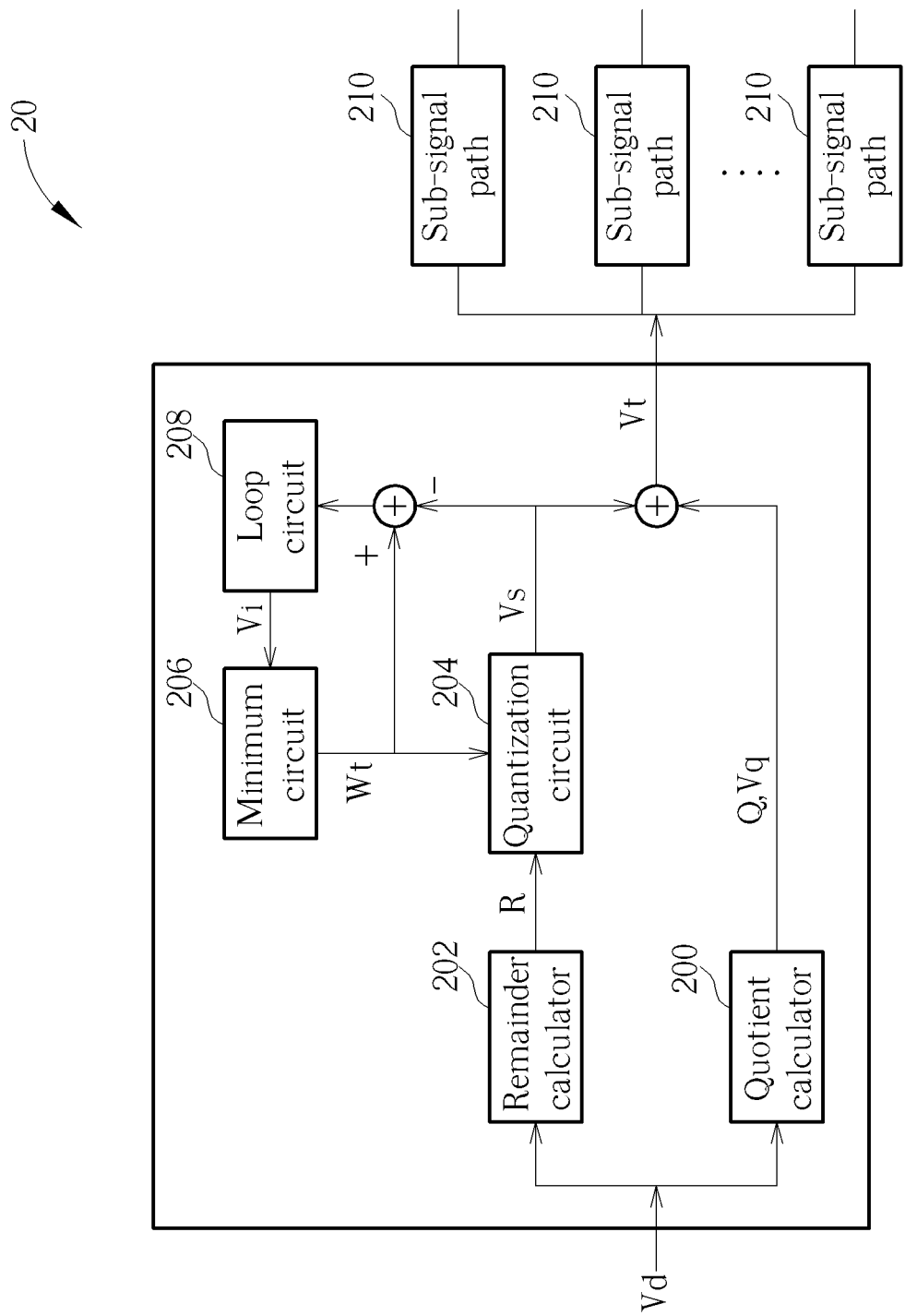
FIG. 2 is a schematic diagram of a vector quantization digital-to-analog circuit according to an embodiment of the present application.

More specifically, please refer to FIG. 2, which is a vector quantization circuit 20 according to an embodiment of the present application. The vector quantization circuit 20 may be implemented by the vector quantization circuit 100. As shown in FIG. 2, the vector quantization circuit 20 is configured to receive the digital signal Vd and allocate as the vector Vt for output. The vector quantization circuit 20 includes a quotient calculator 200, a remainder calculator 202, a quantization circuit 204, a minimum circuit 206 and a loop circuit 208, wherein the remainder calculator 202 is configured to receive the digital signal Vd to generate a remainder R to the quantization circuit 204. The quantization circuit 204 is configured to allocate the remainder R as a sorting vector Vs according to a weighted vector Wt, and the quotient calculator 200 is connected to the quantization circuit 204 for receiving the digital signal Vd to generate a quotient Q and a quotient vector Vq. After summing the sorting vector Vs and the quotient vector Vq, the vector Vt vector-quantized from the digital signal Vd is obtained. Notably, the vector quantization circuit 20 vector-quantizes the digital signal Vd as the vector Vt, so as to averagely allocate the allocation times of the digital-to-analog conversion sub-circuits 108 respectively. Therefore, the quotient calculator 200 and the remainder calculator 202 have the identical amount of N with the digital-to-analog conversion sub-circuits 108, and the dimensions of the quotient vector Vq, the sorting vector Vs, the weighted vector Wt and the vector Vt are identical to the amount N of the digital-to-analog conversion sub-circuits 108.

The quotient calculator 200 is configured to calculate the quotient Q, which is the digital signal Vd divided by N, and output the quotient vector Vq (Q, Q, . . . , Q) of N dimensions, wherein the quotient vector Vq includes N quotients Q, and the remainder calculator 202 is configured to obtain the remainder R, which is the digital signal Vd divided by N. With operations of the minimum circuit 206 and the loop circuit 208, the quantization circuit 204 sorts and outputs the sorting vector Vs of N dimensions, and after summing the quotient vector Vq and the sorting vector Vs, the vector Vt is determined and output. Therefore, the vector quantization circuit 20 utilizes the quotient calculator 200 to allocate the digital signal Vd as the quotient vector Vq with N quotients Q, and the remaining remainders R are sorted as the sorting vector Vs including amount of R of 1 by the quantization circuit 204, the minimum circuit 206 and the loop circuit 208. In an embodiment, since the vector quantization circuit 20 allocates the digital signal Vd, a total sum of the digital signals Vt1-VtN of the output vector Vt remains unchanged and is identical to the value of the digital signal Vd.

In brief, the vector quantization circuit 20 utilizes the quantization circuit 204, the minimum circuit 206 and the loop circuit 208 to execute the vector quantization operation to obtain the quotient vector Vq, and allocate the obtained sorting vector Vs to the remainder R according to the weighted vector Wt, and to generate the vector Vt after summing the sorting vector Vs and the quotient vector Vq, such that the vector Vt transmits the allocated quotient Q and the remainder R to a plurality of sub-signal paths 210. Therefore, the present application allocates the digital signal Vd as the vector Vt by the implementation of the vector quantization method and transmits the vector Vt to the sub-signal paths 210.

Furthermore, the weighted vector Wt stores the allocation times and the weighted information of the respective digital-to-analog conversion sub-circuits 108, the quantization circuit 204 converts the remainder R into the sorting vector Vs according to the values of the weighted vector Wt, which includes the same amount with the remainder R of 1 and the amount of N—R of 0, to output the sorting vector Vs, and the sorting vector Vs is summed with the quotient vector Vq to output the vector Vt. Simultaneously, the sorting vector Vs is output to the minimum circuit 206, and the loop circuit 208 performs the operation to update the weighted vector Wt. More specifically, the weighted vector Wt is subtracted from the sorting vector Vs and output to the loop circuit 208. Since the sorting vector Vs is an allocation result of the remainder, and the weighted vector Wt is stored with the weighted values, a subtraction result of the weighted vector Wt and the sorting vector Vs represents that the weightings of the weighted vector Wt are updated, and the loop circuit 208 receives the subtraction result and performs a delay, and then an initial vector Vi is transmitted to the minimum circuit 206, which detects a minimum of the initial vector Vi, and offsets the values of the initial vector Vi, to return the minimum of the initial vector Vi to zero, so as to generate a new weighted vector Wt. Therefore, the larger of the values of the weighted vector Wt, the fewer of the allocation times, the higher priority of the allocated remainder R. The loop circuit 208 provides the delay to store the weighted values, and the minimum circuit 206 subtracts the minimum of the initial vector Vi to maintain the minimum of the weighted vector Wt as zero, so as to avoid the weighted vector Wt from circumstance of overflow or underflow and keep accuracy of the operations.

Therefore, the vector quantization circuit 20 averagely allocates the quotient Q, allocates the remainder R with the vector quantization method and allocates the input signal Vd as the vector Vt to output to N sub-signal paths 210. Preferably, in order to allocate the input signal Vd to the N sub-signal paths 210 accurately, a divisor of the quotient calculator 200 and the remainder calculator 202 may be equal to the amount N of the sub-signal paths 210. In this way, the vector quantization circuit 20 may convert the input signal Vd into the quantized vector Vt. Since the vector quantization method may increase the entropy of the allocation of the remainder R, reduce a repetition of selected elements when the sub-signal paths 210 generates the analog signal and further eliminate the generated noise voltage to achieve b analog signal with better quantity and optimize the digital-to-analog conversion circuit.

Figure 3:
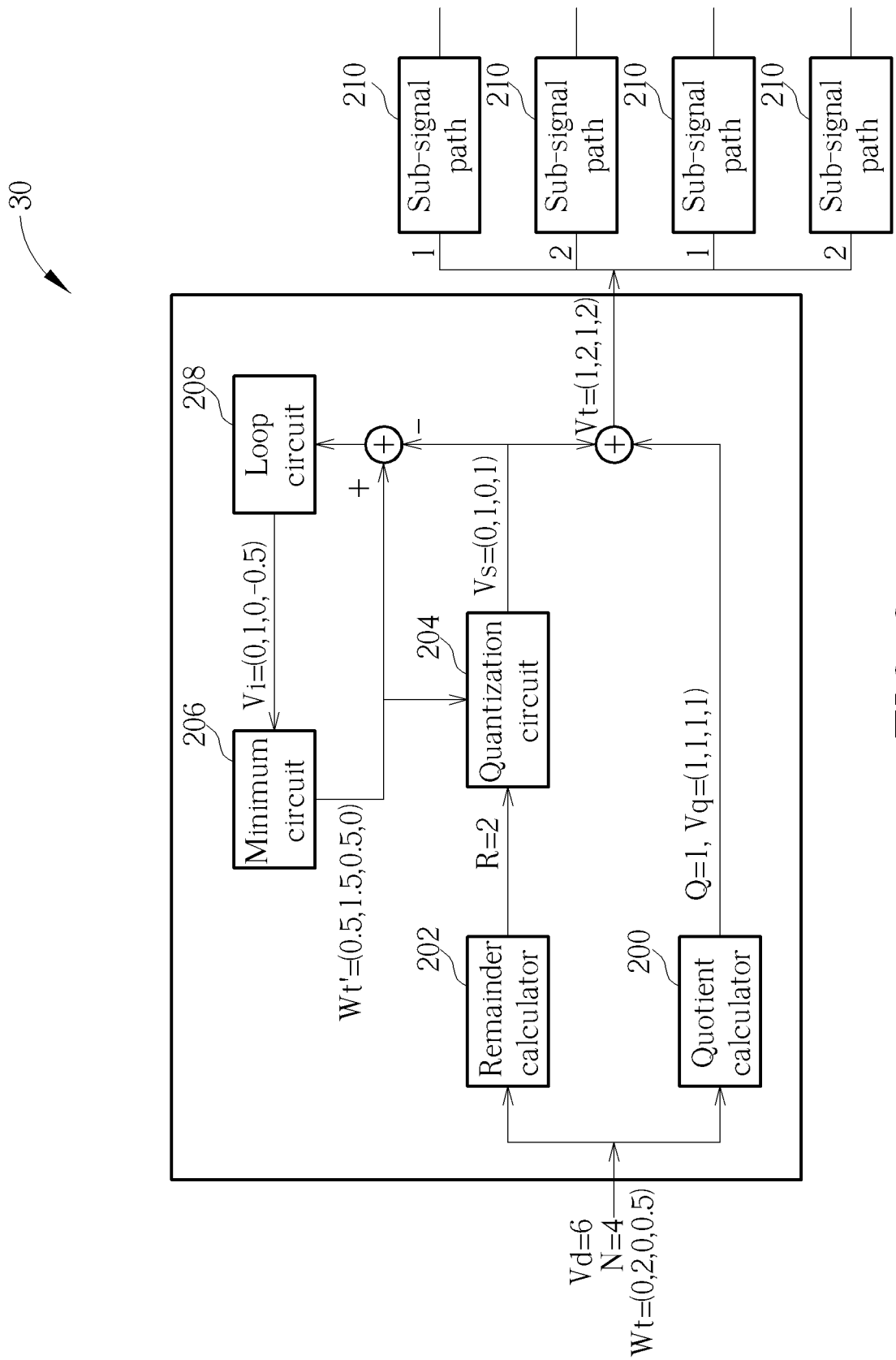
FIG. 3 is a schematic diagram of a signal operation of a vector quantization digital-to-analog circuit according to an embodiment of the present application.

For example, please refer to FIG. 3, which is a signal operation of a vector quantization digital-to-analog conversion circuit 30 according to an embodiment of the present application. As shown in FIG. 3, the vector quantization circuit 30 is an embodiment of the vector quantization circuit 20 when N=4, i.e. the vector quantization circuit 30 is coupled to 4 sets of the sub-signal paths 210, which exists the weighted vector Wt (0, 2, 0, 0.5). When the input signal Vd is 6 and input to the vector quantization circuit 30, the quotient calculator 200 obtains the output quotient Q of 1 and the quotient vector Vq is (1, 1, 1, 1). The remainder calculator 202 obtains the remainder R of 2 and outputs the remainder R to the quantization circuit 204 based on the input signal Vd of 6 and the divisor of 4. Since the remainder is 2, the quantization circuit 204 selects two maximal numbers among the weighted vector Wt, which is (0, 2, 0, 0.5), according to the remainder R of 2, and allocates the remainder R to vector dimensions corresponding to the two maximal numbers to generate the sorting vector Vs of (0, 1, 0, 1). The quotient vector Vq (1, 1, 1, 1) and the sorting vector Vs (0, 1, 0, 1) are summed to obtain the output vector Vt (1, 2, 1, 2) of the vector quantization circuit. Notably, since the vector quantization circuit 30 allocates the input numbers without changing the values thereof, the sum of the values of the vector Vt is equal to the value of 6 of the input digital signal Vd.

Notably, after a vector allocation circuit generates the sorting vector Vs, the sorting vector Vs updates the weighted vector Wt by a cycle of the loop circuit, wherein after the weighted vector Wt (0, 2, 0, 0.5) is subtracted from the sorting vector Vs (0, 1, 0, 1) and input to the loop circuit for the delay, the initial vector Vi (0, 1, 0, −0.5) is generated, the minimum circuit obtains the minimum −0.5 among the initial vector Vi and all the numbers of the initial vector Vi are subtracted from the minimum −0.5 to generate a new weighted vector Wt' (0.5, 1.5, 0.5, 0) so as to provide for the next digital signal Vd as the input for operation. The minimum circuit 206 is utilized for detecting the minimum −0.5 and returning the minimum of the weighted vector Wt to zero, so as to prevent the weighted vector Wt from the circumstance of overflow or underflow and maintain the accuracy of the operation.

Figure 4:
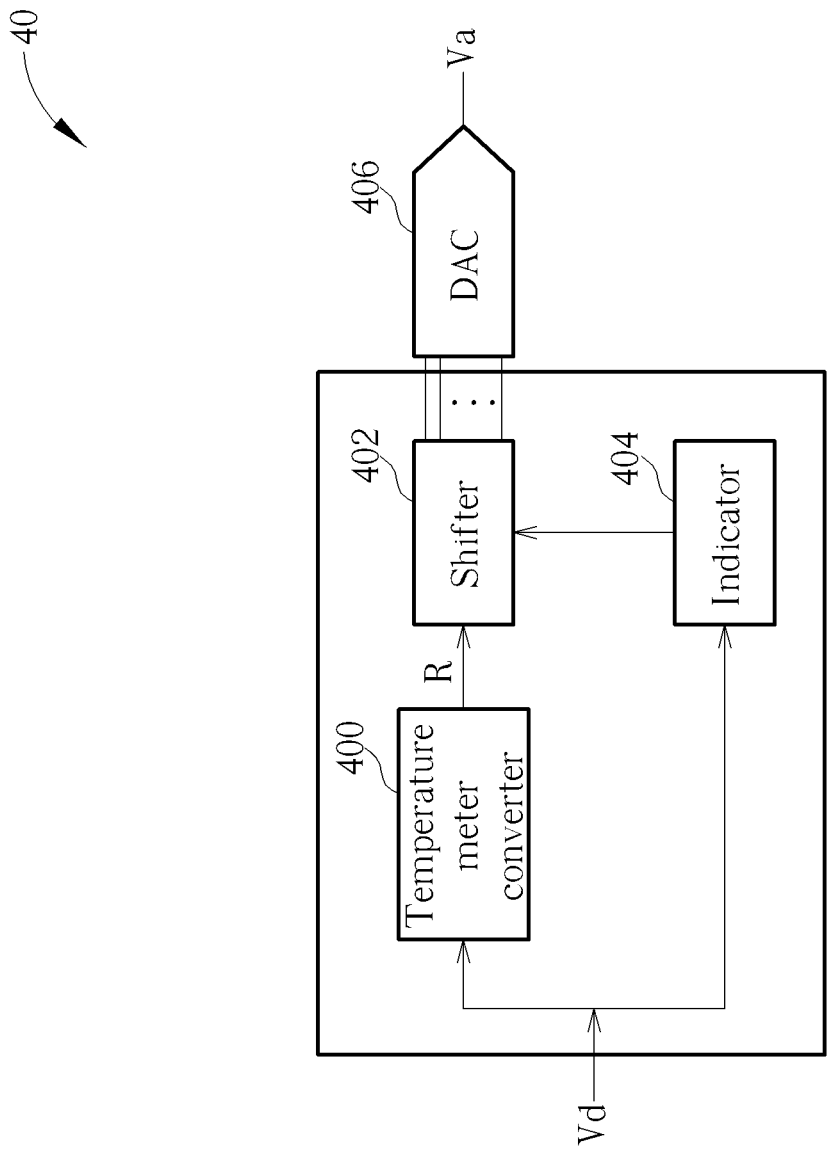
FIG. 4 is a schematic diagram of a signal operation of a vector quantization digital-to-analog circuit according to an embodiment of the present application.

In comparison, please refer to FIG. 4, which is a schematic diagram of a digital-to-analog converter 40 with the data weighted averaging technique according to an embodiment of the present application. The conventional oversampling analog-to-digital converter with the data weighted averaging technique may reduce the repetition of the selected elements of the digital-to-analog converter 40, achieve the effect of noise shaping and reduce the noise voltage of the oversampling analog-to-digital converter. The input signal Vd of the digital-to-analog converter 40 is first converted by a temperature meter converter 400, then performed circular shifting by a shifter 402 according to a circular indication of an indicator 404, and the shifted temperature metering is output to the digital-to-analog converter to indicate the operations of interior elements of the digital-to-analog converter. With the operation of the circular shifting, the data weighted averaging technique may averagely record and allocate the allocation times of the interior elements of the digital-to-analog converter 406 so as to distribute the noise voltage in spectrum caused by the element mismatch and improve the signal quality, which may be deducted as 1st order mismatch shaping in mathematics. Since the effect of the mismatch shaping is related to the input data, the repetition of the selected elements of the digital-to-analog converter 406 is caused when the specific input data were input, and the repetition of the selected elements causes the noise voltage resulted by the element mismatch in spectrum, which further affects the signal quality and circuit performance. The said temperature meter converter may be a temperature meter encoder.

In comparison with the digital-to-analog converter 40, when the vector quantization digital-to-analog conversion circuit 10 is applied to the oversampling analog-to-digital converter, the input signal Vd is allocated to the sub-signal paths 110, the allocation of the vector quantization method is performed to achieve higher entropy than that of the interior selected elements of the digital-to-analog conversion sub-circuits 108 so as to reduce the noise voltage caused by the repetition of the interior selected elements, and achieve the effect of noise shaping, which cannot be achieved by the data weighted averaging method, and achieve better signal quality of the analog signal.

Notably, the vector quantization digital-to-analog conversion circuit of the present application may be applied to the oversampling converter for performing the conversion between the digital signal and the analog signal, wherein the oversampling converter includes a loop filter, a quantizer and a vector quantization digital-to-analog converter. The oversampling converter is configured to utilize the loop filter, the quantizer and the vector quantization digital-to-analog converter to perform a delta-sigma modulation, which shifts the noise voltage out of the band, i.e. the noise voltage shaping, and further improves the signal to noise ratio.

Figure 5:
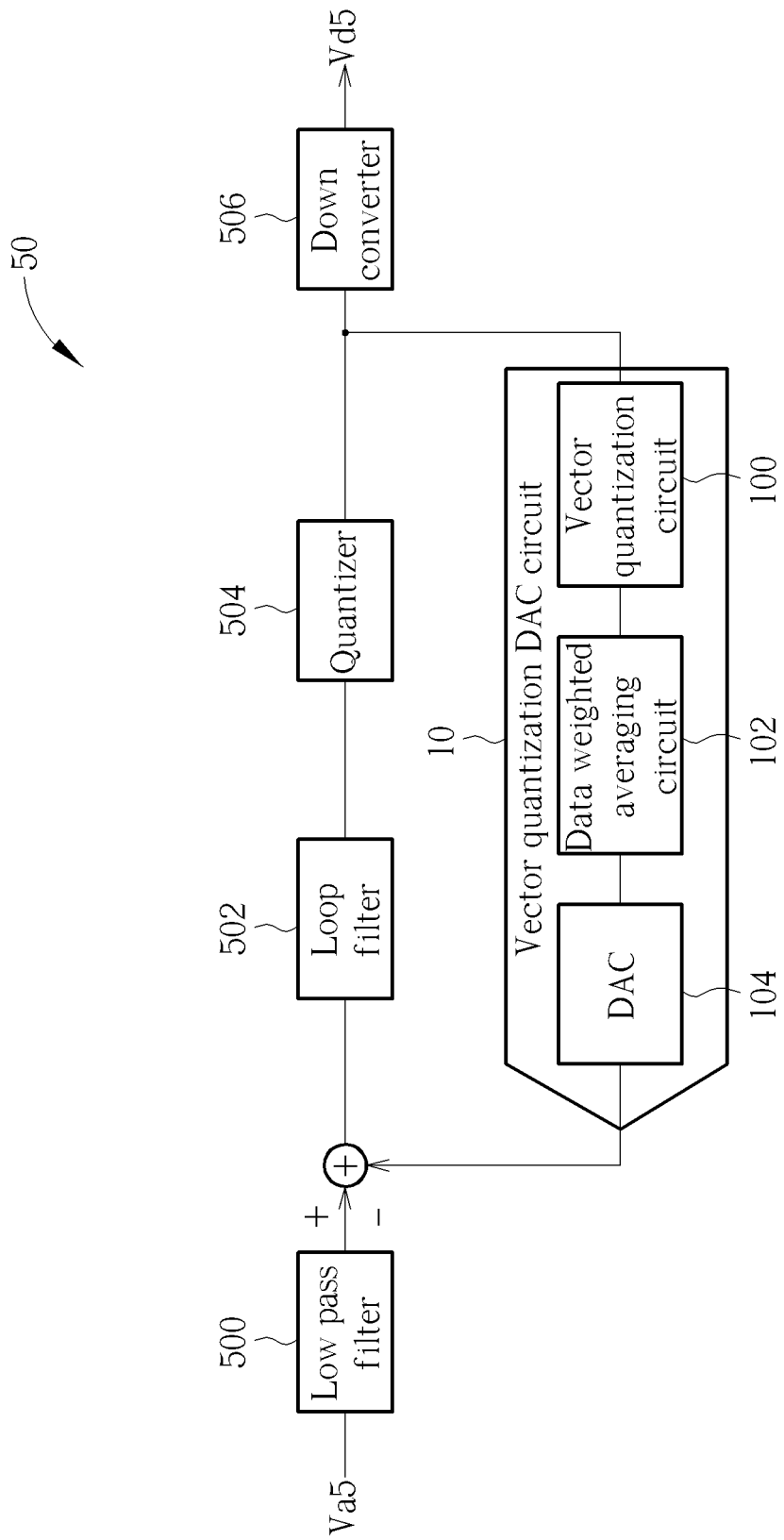
FIG. 5 is a schematic diagram of an oversampling analog-to-digital conversion circuit according to an embodiment of the present application.

For example, please refer to FIG. 5, which is a schematic diagram of an oversampling analog-to-digital conversion circuit 50 according to an embodiment of the present application. As shown in FIG. 5, the oversampling analog-to-digital conversion circuit 50 is configured to receive an analog signal Va5 so as to generate a digital output signal Vd5, wherein the oversampling analog-to-digital conversion circuit 50 includes a low pass filter 500, a loop filter 502, a quantizer 504 and the vector quantization digital-to-analog conversion circuit 10, wherein the loop filter 502 is coupled between the low pass filter 500 and the quantizer 504, the vector quantization digital-to-analog conversion circuit 10 is coupled after the quantizer 504. The low pass filter 500 is configured to receive the analog signal Va5, operate with a feedback analog signal, which is generated by the vector quantization digital-to-analog conversion circuit 10, and transmit to the loop filter 502. A down converter 506 is coupled to the quantizer 504, which is configured to generate the output signal Vd5.

Figure 6:
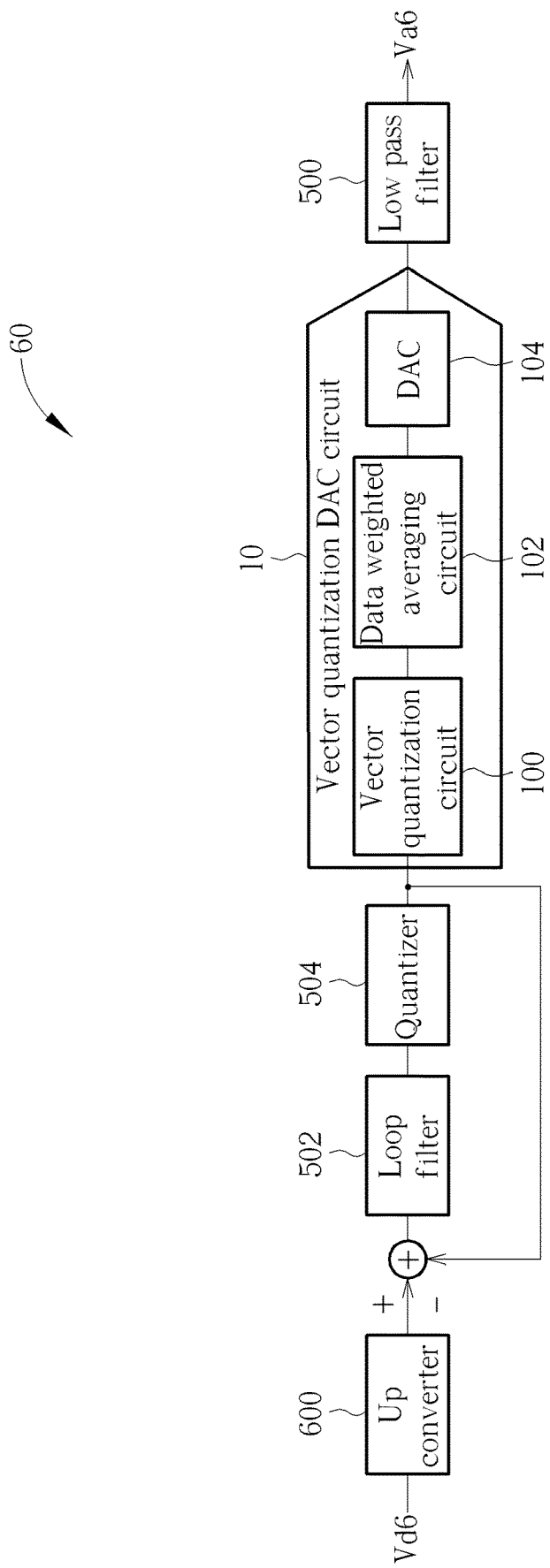
FIG. 6 is a schematic diagram of an oversampling digital-to-analog conversion circuit according to an embodiment of the present application.

In addition, please refer to FIG. 6, which is schematic diagram of an oversampling digital-to-analog conversion circuit 60 according to an embodiment of the present application. As shown in FIG. 6, the oversampling digital-to-analog conversion circuit 60 is configured to receive a digital signal Vd6 so as to generate an analog output signal Va6. The oversampling digital-to-analog conversion circuit 60 includes an up converter 600, the loop filter 502, the quantizer 504, the vector quantization digital-to-analog conversion circuit 10 and the low pass filter 500, wherein the quantizer 504 is coupled between the loop filter 502 and the vector quantization digital-to-analog conversion circuit 10. The up converter 600 is configured to receive the input digital signal Vd6 and operate with the quantization output generated by the quantizer 504, for transmitting to the loop filter 502. An output analog signal of the vector quantization digital-to-analog conversion circuit 10 is processed by the low pass filter 500 to generate the analog output signal Va6.

Figure 7:
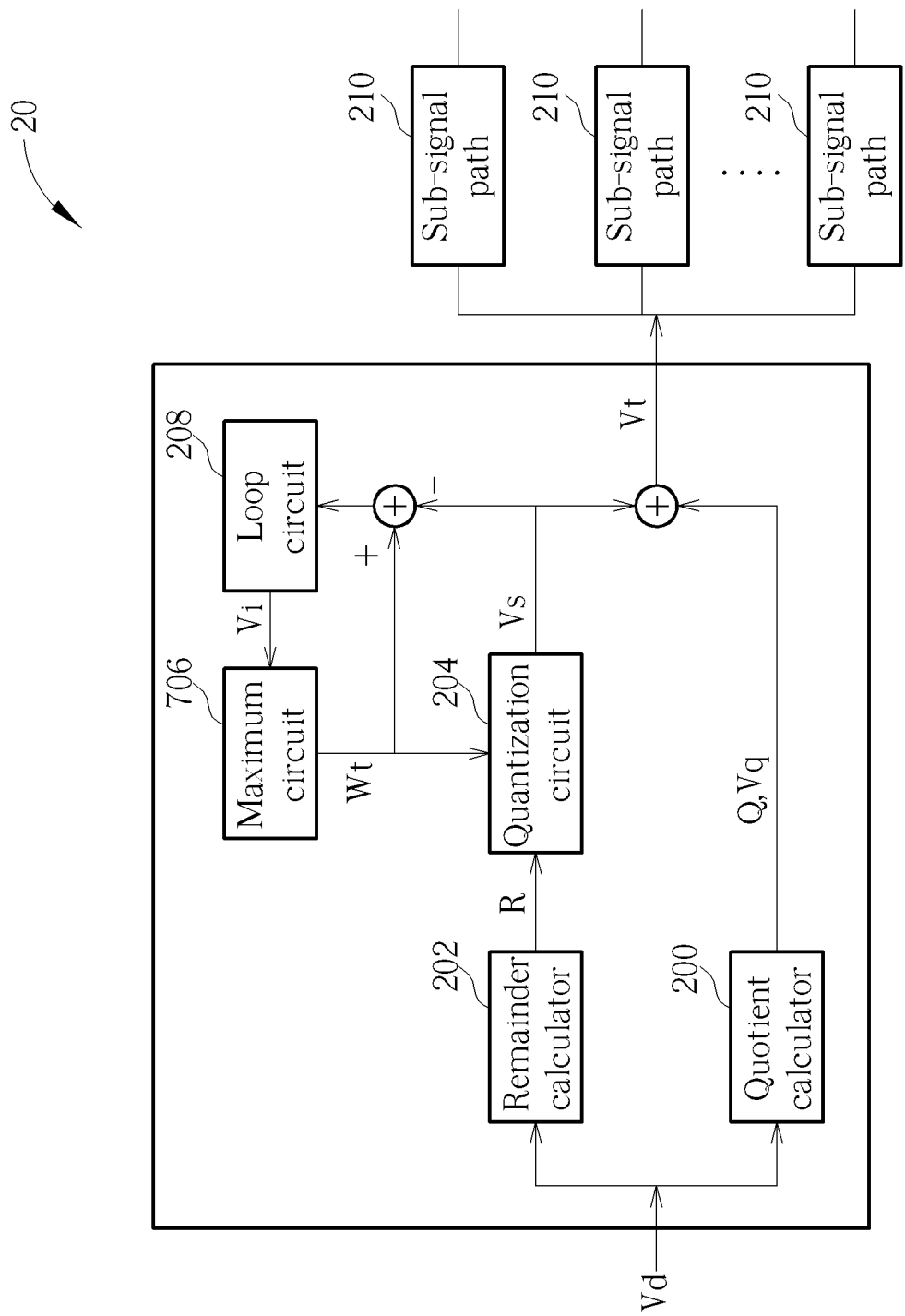
FIG. 7 is another schematic diagram of a vector quantization circuit according to an embodiment of the present application.

Notably, the embodiments mentioned in the above are utilized for illustrating the concept of the present application, those skilled in the art may make modifications and alterations accordingly. For example, except for performing the allocation of the digital signal Vd as the vector Vt, a direct-current offset may be existed between the digital signal Vd and the vector Vt in the present application. The digital signal Vd may be coupled to an adder and added with a direct-current offset value before the digital signal Vd is input to the quotient calculator and the remainder, such that an offset is steadily generated by the vector Vt and the digital signal Vd. In addition, the present application is not limited to utilizing the minimum circuit to achieve the idea of preventing the overflow or of the underflow, a maximum circuit may be utilized to generate the weighted vector Wt. Please refer to FIG. 7, which is a schematic diagram of a vector quantization circuit 70 according to an embodiment of the present application. The vector quantization circuit 70 is similar to the vector quantization circuit 20, and the symbols remain the same of the same elements. After the initial vector Vi is input to a maximum circuit 706, the maximum circuit 706 may detect a maximum of the initial vector Vi. If the detected maximum is smaller than a specific value, the present application may offset all numbers of the initial vector Vi to adjust the maximum as the specific value and output a weighted vector Wt to the quantization circuit 204 for performing the allocation of the remainder R, which belongs to the scope of the present application.

Figure 8:
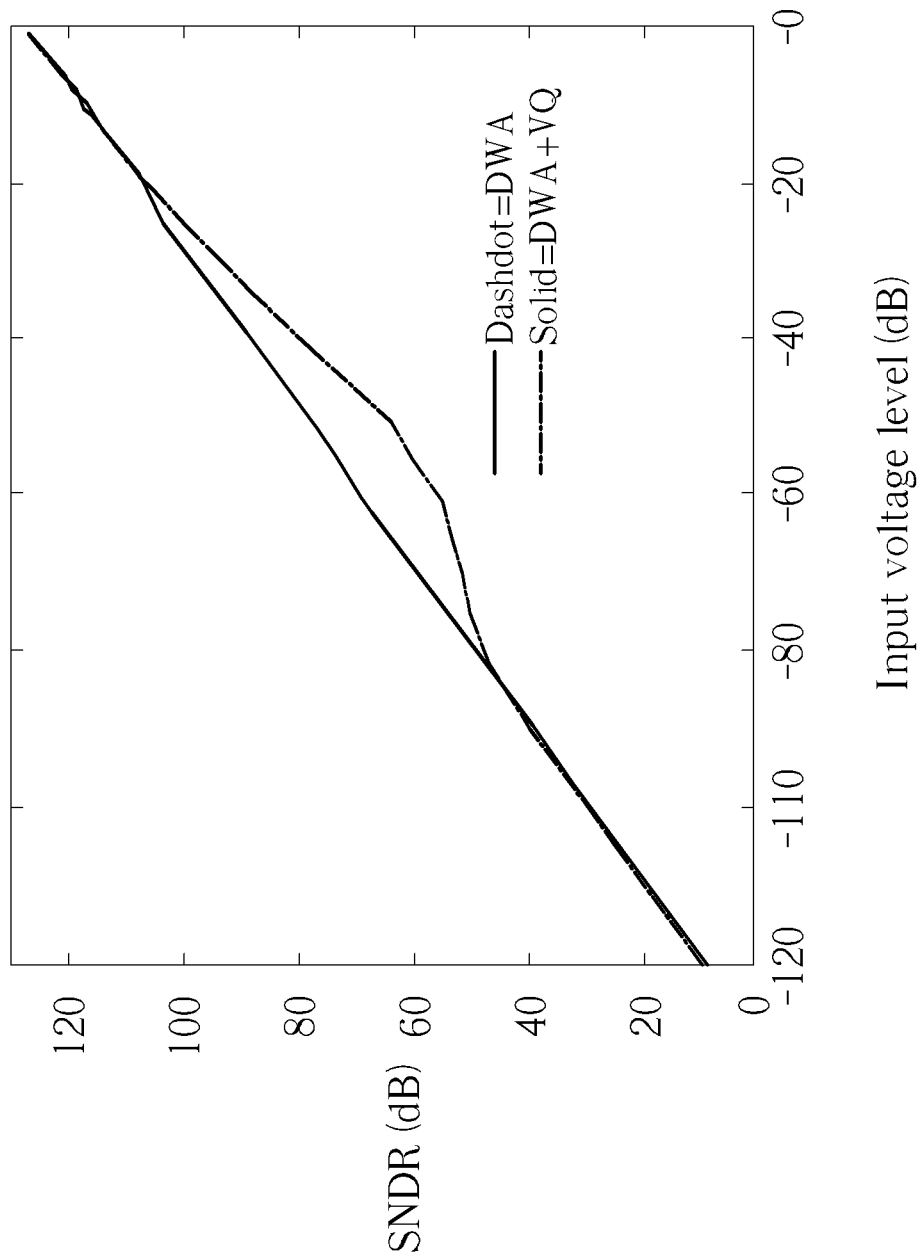
FIG. 8 is a schematic diagram of a signal-to-noise ratio of an oversampling digital-to-analog conversion circuit according to an embodiment of the present application.

Please refer to FIG. 8, which is a schematic diagram of the signal-to-noise ratio of the oversampling digital-to-analog conversion circuit 60 according to an embodiment of the present application. In comparison with the conventional technique, which adopts the oversampling digital-to-analog conversion circuit with the data weighted averaging technique, where the SNR is shown in the figure, which at most loses 16 dB. However, the SNR of the oversampling digital-to-analog conversion circuit 60 of the present application at most loses 1 dB, which can be known that the present application effectively improves drawbacks of the conventional technique, reduces the noise voltage of the oversampling converter and achieves better SNR.

As can be known from the above, the present application utilizes the vector quantization circuit to allocate the digital signal to sub-signal paths, which not only improves the noise voltage caused by the repetition of the interior selected elements of the digital-to-analog conversion circuit with the data weighted averaging circuit, but also has no necessity to add redundant interior elements to the digital-to-analog conversion circuit when an input bit number is not changed, since a bit number of the digital-to-analog conversion circuit is related to a number of the interior elements. Besides, since an area cost of the vector quantization circuit is relatively lower than that of the interior elements of the digital-to-analog conversion circuit, the vector quantization circuit may effectively reduce the noise voltage of the oversampling converter with the area cost close to that of the conventional structure.

In summary, the present application improves the noise voltage caused by the repetition of the interior selected elements of the digital-to-analog conversion circuit with the data weighted averaging circuit, and accordingly, the oversampling converter may further increase the entropy of the interior elements of the analog-to-digital converter, so as to eliminate the noise voltage in the spectrum and achieve better SNR.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A vector quantization digital-to-analog conversion circuit, for converting a digital signal to an analog signal, characterized by comprising:
    a vector quantization circuit, configured to receive the digital signal and generate a vector quantization signal;
    a data weighted averaging circuit, coupled to the vector quantization circuit, comprising a plurality of data weighted averaging sub-circuits, configured to receive the vector quantization signal to generate a plurality of data weighted averaging signals; and
    a digital-to-analog conversion circuit, coupled to the data weighted averaging circuit, comprising a plurality of digital-to-analog conversion sub-circuits, configured to receive the data weighted averaging signal to generate the analog signal.

2. The vector quantization digital-to-analog conversion circuit of claim 1, characterized in that, the plurality of digital-to-analog conversion sub-circuits are configured to receive the data weighted averaging signal to generate an analog voltage and output the analog signal after summing the analog voltage.

3. The vector quantization digital-to-analog conversion circuit of claim 2, characterized by further comprising:
    an adder, coupled to the plurality of digital-to-analog conversion sub-circuits and configured to sum the analog voltage.

4. The vector quantization digital-to-analog conversion circuit of claim 1, characterized in that, the plurality of data weighted averaging sub-circuits are respectively coupled to the plurality of digital-to-analog conversion sub-circuits; an amount of the plurality of data weighted averaging sub-circuits is identical to an amount of the plurality of digital-to-analog conversion sub-circuits.

5. The vector quantization digital-to-analog conversion circuit of claim 1, characterized in that, the vector quantization circuit comprises:
    a quotient calculator, configured to receive the digital signal to generate a quotient vector;
    a remainder calculator, configured to receive the digital signal to generate a remainder;
    a quantization circuit, coupled to the remainder calculator, configured to receive the remainder to output a sorting vector;
    wherein after summing the quotient vector and the sorting vector, the vector quantization signal is generated.

6. The vector quantization digital-to-analog conversion circuit of claim 5, characterized in that, the vector quantization circuit further comprises:
    a loop circuit, coupled to the quantization circuit, configured to receive a subtraction result of a weighted vector and the sorting vector to output an initial vector; and
    an extreme circuit, coupled to the loop circuit, configured to receive the initial vector to output an updated weighted vector.

7. The vector quantization digital-to-analog conversion circuit of claim 6, characterized in that, information of allocation times of the sorting vector is recorded in the updated weighted vector.

8. The vector quantization digital-to-analog conversion circuit of claim 6, characterized in that, the quantization circuit is configured to receive the remainder and sort the remainder according to the updated weighted vector to output the sorting vector; the sorting vector includes digital numbers 0 and 1, an amount of the digital number 1 of the sorting vector is identical to the remainder and an amount of the digital number 0 of the sorting vector is identical to N subtracting the remainder, and N is an amount of the plurality of digital-to-analog conversion sub-circuits; the quotient vector includes N quotients.

9. The vector quantization digital-to-analog conversion circuit of claim 6, characterized in that, the loop circuit is configured to provide a delay and receive the subtraction result of the weighted vector and the sorting vector, the subtraction result is outputted after the delay, taken as the initial vector and transmitted to the extreme circuit.

10. The vector quantization digital-to-analog conversion circuit of claim 6, the updated weighted vector comprises at least a numerical value of zero, and the numerical value is a minimum of the updated weighted vector.

11. The vector quantization digital-to-analog conversion circuit of claim 10, characterized in that, the extreme circuit is a minimum circuit, configured to detect a minimum of the initial vector and to subtract the minimum from all numerical values of the initial vector to generate the updated weighted vector.

12. The vector quantization digital-to-analog conversion circuit of claim 6, characterized in that, the quotient calculator and the remainder calculator have a same divisor, wherein the divisor and a vector dimension of the updated weighted vector, the initial vector, the sorting vector and the quotient vector are identical; an amount of the quotient calculator and the remainder calculator is identical to an amount of the plurality of digital-to-analog conversion sub-circuits.

13. A vector quantization digital-to-analog conversion method, for converting a digital signal to an analog signal, characterized by comprising:
  receiving the digital signal and generate a vector quantization signal;
  receiving the vector quantization signal to generate a plurality of data weighted averaging signals; and
  receiving the data weighted averaging signal to generate the analog signal.

14. An oversampling converter, configured to convert an analog signal to a digital signal, characterized by comprising:
  a loop filter, configured to output a loop filtering signal;
  a quantizer, configured to output a quantization digital signal; and
  a vector quantization digital-to-analog conversion circuit, configured to output a vector quantization analog signal, wherein the vector quantization digital-to-analog conversion circuit is the vector quantization digital-to-analog conversion circuit in claim 1;
  wherein the quantizer is coupled between the loop filter and the vector quantization digital-to-analog conversion circuit.

15. The oversampling converter of claim 14, characterized in that, the oversampling converter is an oversampling analog-to-digital converter, configured to convert the analog signal to the digital signal.

16. The oversampling converter of claim 15, characterized in that, the oversampling converter further comprises a low pass filter, configured to receive the analog signal, generate a low pass analog signal, subtract from the vector quantization analog signal, and output to the loop filter.

17. The oversampling converter of claim 15, characterized in that, the oversampling converter further comprises a down converter coupled to the quantizer, configured to receive the quantization digital signal to output the digital signal.

18. The oversampling converter of claim 14, characterized in that, the oversampling converter is an oversampling digital-to-analog converter, configured to convert the digital signal to the analog signal.

19. The oversampling converter of claim 18, characterized in that, the oversampling converter further comprises an up converter, configured to receive the digital signal, generate an up-converted digital signal, subtract from the quantization digital signal, and output to the loop filter.

20. The oversampling converter of claim 18, characterized in that, the oversampling converter further comprises a low pass filter coupled to the vector quantization digital-to-analog conversion circuit, configured to receive the vector quantization analog signal to output the digital signal.

* * * * *